US006005351A

United States Patent [19]

Sverdrup et al.

[11] Patent Number: 6,005,351

[45] Date of Patent: Dec. 21, 1999

[54] FLAT PANEL DISPLAY DEVICE USING THIN DIAMOND ELECTRON BEAM AMPLIFIER

[75] Inventors: Lawrence H. Sverdrup, Poway; Shiow-Hwa Lin; Eric J. Korevaar, both of San Diego; Brett A. Spivey, Encinitas; Kenneth Y. Tang, Alpine, all of Calif.

[73] Assignee: Thermotrex Corporation, San Diego, Calif.

[21] Appl. No.: 08/856,381

[22] Filed: May 14, 1997

Related U.S. Application Data

[63] Continuation of application No. 08/540,006, Oct. 6, 1995, abandoned, which is a continuation-in-part of application No. 08/513,169, Aug. 9, 1995.

[51] Int. Cl.[6] .......... H03F 3/54

[52] U.S. Cl. .......... 315/169.1; 315/169.3; 330/44

[58] Field of Search .......... 330/44, 45, 46; 313/399, 103 R, 105 R, 103 CM, 105 CM; 315/169.1, 169.3, 3

[56] References Cited

U.S. PATENT DOCUMENTS

| | | | |
|---|---|---|---|
| 3,725,803 | 4/1973 | Yoder | 330/46 |
| 3,922,616 | 11/1975 | Weiner | 330/44 |
| 4,993,033 | 2/1991 | Lin | 372/30 |
| 5,052,006 | 9/1991 | Phillips et al. | 372/44 |
| 5,355,093 | 10/1994 | Treado et al. | 330/45 |

*Primary Examiner*—David H. Vu
*Attorney, Agent, or Firm*—Fish & Anderson P.C.

[57] ABSTRACT

A thin diamond electron beam amplifier. The illumination side of a thin diamond is illuminated by a seed electron beam creating electron-hole pairs in the diamond. A voltage potential provides an electric field between the illumination side of the diamond and an acceleration grid opposite the emission side of the diamond. Electrons released in the diamond are accelerated through the emission side of the diamond toward the acceleration grid creating an amplified electron beam. Preferred embodiments of the present invention are useful to provide flat panel displays and replacements for thermionic cathodes, cathode ray tubes, fast photodetectors and image intensifiers.

3 Claims, 10 Drawing Sheets

FLAT PANEL DISPLAY DEVICE USING THIN DIAMOND ELECTRON BEAM AMPLIFIER

This is a continuation of application of Ser. No. 08/540,006, filed Oct. 6, 1995, now abandoned, which is a Continuation-In-Part (CIP) application Ser. No. 08/513/169 filed Aug. 9, 1995. The present invention relates to amplifiers and in particular to electron beam amplifiers.

BACKGROUND OF THE INVENTION

Diamond is an excellent electrical insulator; however, it is known that diamond can be made to conduct electrical current when illuminated with a beam of electrons. One of the applicants (Lin) has patented a diamond switch (U.S. Pat. No. 4,993,033 issued Feb. 12, 1991) in which a diamond target conducts electrical current in an electrical circuit when the diamond target is illuminated by electrons from an electron emitting surface. The teachings of this patent are incorporated herein by reference.

Field emission electronic devices are well known. In U.S. Pat. No. 5,355,093 issued to Treado and Lin on Oct. 11, 1994, an electronic amplifier circuit was described in which a microwave signal stimulated a gated field emission array to emit a modulated electron beam which in turn illuminated a diamond in a diamond switch to produce an amplified microwave signal in the amplifier circuit. The teachings of that patent are also incorporated herein by reference.

Flat panel display devices are relatively new but they have recently become big business. The January issue of Photonics Spectra predicts that the market for flat panel displays will reach $20 billion by the year 2000. Active matrix liquid crystal display (AMLCO) devices account for about 87% of flat panel display sales in 1995. According to the May 1993 issue of IEEE Spectrum, field emitter devices accounted for 0.1% of the world market in flat panel display devices. Prior art FED devices are described in "Beyond AMLCD's: Field Emission's Displays?" in the November 1994 issue of Solid State Technology which article is incorporated herein by reference.

FIG. 1 describes a typical FED device. Electrons are liberated from emitter tip 2 on cathode plate 4 and the electrons are accelerated (by an electrical potential between cathode plate 4 and electrode layer 10) toward phosphor layer 6 on face plate 8. Voltage applied to gates 12 control electron flow and thus the brightness of individual pixel areas of phosphor layer 6. Phosphor layer 6 and electrode layer 10 are mounted on glass faceplate 8.

Most FED's must be operated at very high vacuum, not only to provide long mean free paths but to maintain a clean environment for the emitters. Cathode plates are typically metals and various techniques have been developed to produce emitter tips in order to increase electron flow from the cathode plate. A serious problem with current FED's is that reverse ion bombardment from the phosphor damages the emitter tips. Another problem is that electric fields near breakdown limits are required for the desired current output resulting in reduced lifetime of the emitter array. Other problems are emission noise and energy spread.

What is needed is a simple device for amplifying an electron beam.

SUMMARY OF THE INVENTION

The present invention provides a thin diamond electron beam amplifier. The illumination side of a thin diamond is illuminated by a seed electron beam creating electron-hole pairs in the diamond. A voltage potential provides an electric field between the illumination side of the diamond and an acceleration grid opposite the emission side of the diamond. Electrons released in the diamond are accelerated through the emission side of the diamond toward the acceleration grid creating an amplified electron beam. Preferred embodiments of the present invention are useful to provide flat panel displays and replacements for thermionic cathodes, cathode ray tubes, fast photodetectors and image intensifiers.

DETAILED DESCRIPTION OF PREFERRED EMBODIMENTS

The present invention can be described by reference to the drawings.

Figure 1:
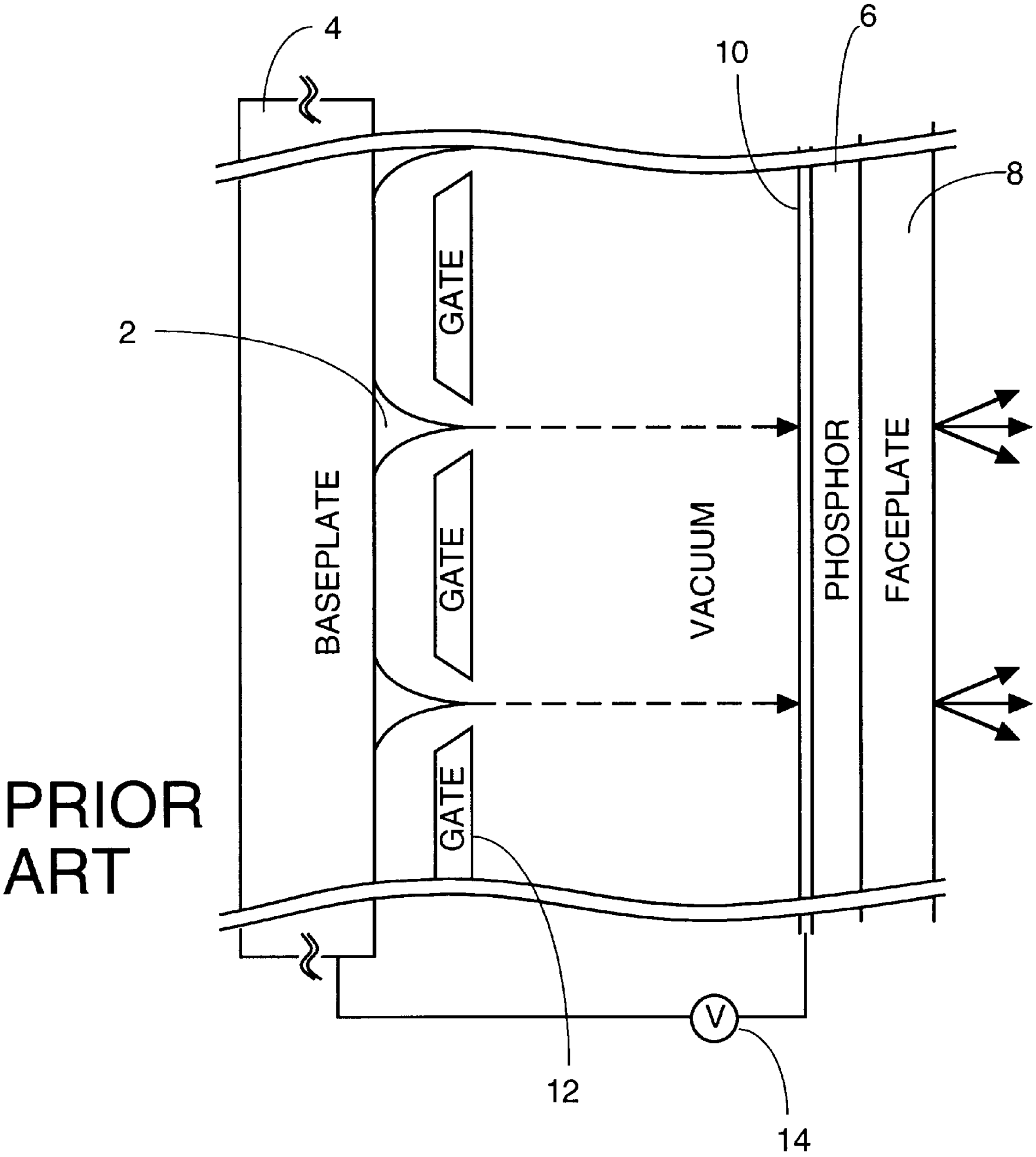
FIG. 1 shows a prior art FED.
Figure 2:
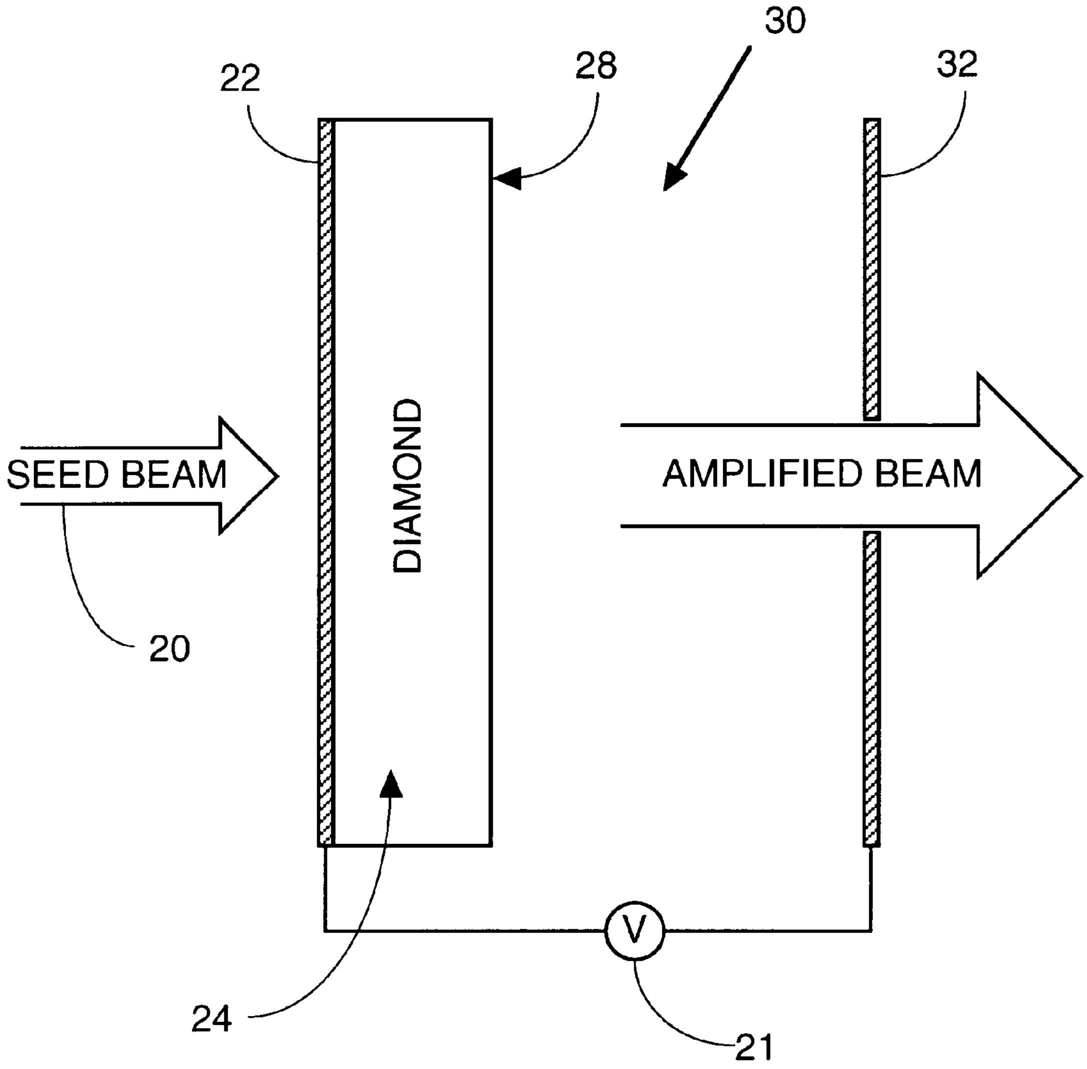
FIG. 2 describes one embodiment of the present invention.
Figure 3:
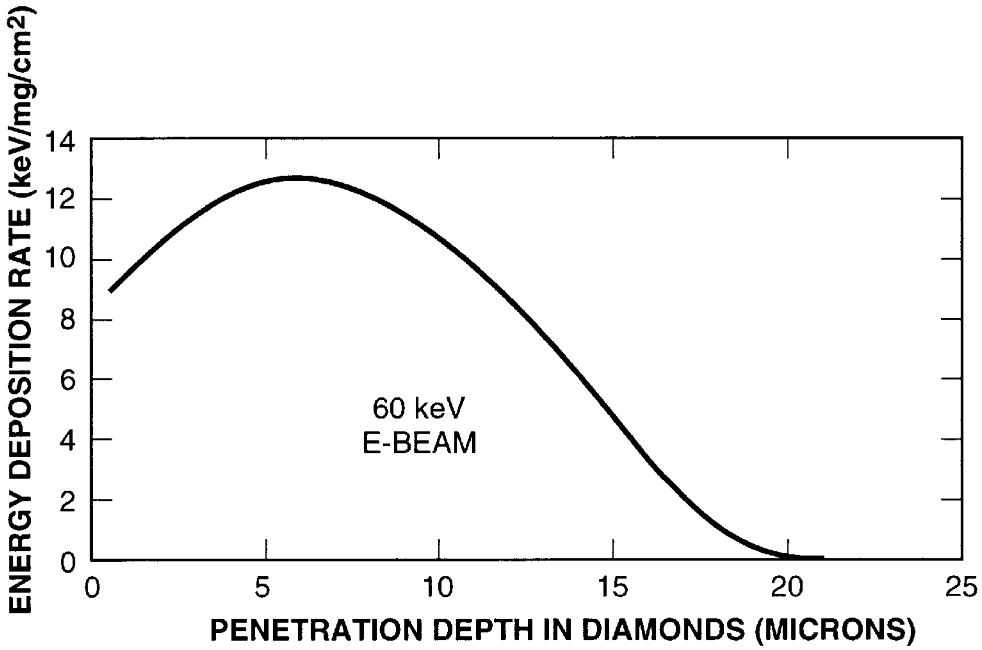
FIG. 3 shows 60 keV electron penetration depth in diamond.

FIG. 2 is a simple drawing showing elements and describing the function of the present invention. Low current electron beam 20 passes through electron transparent electrode 22 to illuminate very thin diamond 24. As the electrons in beam 20 interact with atoms in diamond 24, about one electron-hole pair is created for each 16.5 eV of energy in beam 20. The thickness of diamond 24 is preferably matched to the energy of electrons in beam 20 such that electrons in beam 20 fully penetrate diamond 24. FIG. 3 shows the energy deposition rate as a function of diamond thickness for a 60 keV electron beams. Thus, for a 60 keV electron beam a diamond thickness of about 15 microns would be recommended. Thinner diamond wafers would be matched with lower energy electron beam. For example 1 $\mu$m thick diamond would be matched with 10 keV electrons. Diamond 24 is fabricated to provide a very small or negative electron affinity (NEA) at emission surface 28. This means there is a very small or zero barrier for electrons leaving diamond 24 and passing into vacuum space 30.

An electric field between transparent electrode 22 and acceleration grid 32 is provided by a voltage source 21. By providing a small vacuum space 30, a very high electric field can be provided with a modest voltage. A good combination is a 100 micron space and a potential of about 1,000 volts to produce a field of about 10 kv/cm in the vacuum region of the diode.

A portion of the electrons generated in diamond 24 are drawn out of diamond 24 by the electric field to create an amplified beam. For example, the theoretical current gain produced by a 10 keV electron could be as high as about 600. Thus, an illumination current of 1.7 mA could theoretically produce an output current of 1000 mA (i.e, one amp.).

The energy spread of the emitted electrons is about ~1 kt where t is the room temperature, and is far smaller than for thermionic emitters. Since there will be a large reservoir of carriers at the conduction band minimum, the emission noise will be small. This is in contrast to conventional field emitters where the statistics of the high energy tail of the electrons results in emission noise.

It is known that electrons in the conduction band of diamond can be drawn out through the hydrogen terminated <111> or <100> surface of diamond to create an electron beam. The problem is how to get electrons into the conduction band of diamond. Attempts have been made to inject electrons directly into the conduction band with a metal contact. Attempts to form a good electron injecting contact with a low work function metal have not been successful. Even if electrons could be injected with a low work function metal contact, electron build up in the diamond due to trapping would retard the current flow. Attempts to form an electron injecting contact by heavily doping the diamond with an n-type dopant have also been unsuccessful. With electron bombardment, we create holes and electrons throughout the volume of the diamond. Electrons created in the conduction band either combine with holes or move toward the emission surface 28 to produce the amplified beam. Holes created in the diamond either combine with electrons or move toward the electrode 22 where they combine with electrons in the electrode. Thus, any trapped carriers are quickly eliminated by recombination and the trapped electron problem is eliminated.

PROOF OF PRINCIPLE EXPERIMENT

Figure 4:
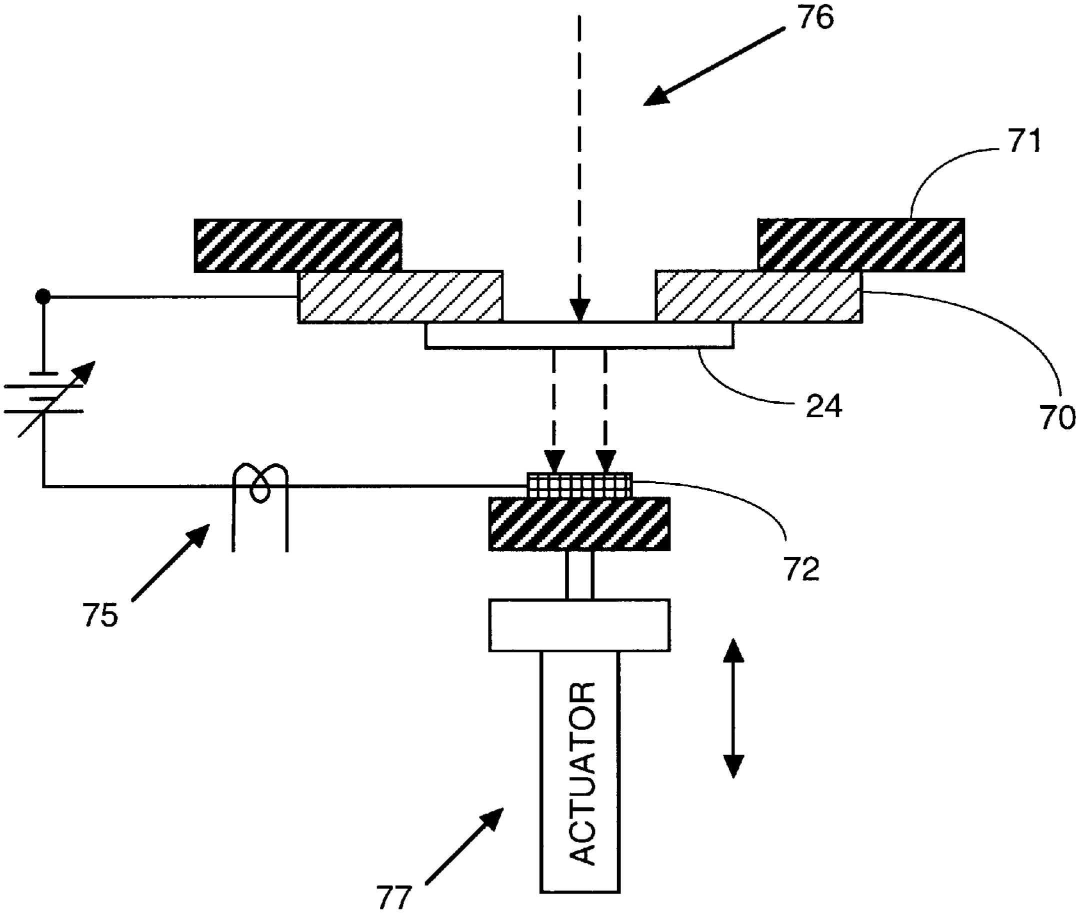
FIG. 4 shows a proof of principal set-up.

A diode assembly was constructed by Applicants to demonstrate the electron bombarded diamond cathode concept. The structure is schematically shown in FIG. 4. It consisted of a 10–15 μm thick, natural type IIa diamond wafer 24 mounted on cathode holder 70. Cathode holder 70 was made of a thin gold electroplated graphite plate. Cathode holder 70 in turn was mounted on insulator 71. A one millimeter diameter hole was drilled in the middle of the cathode holder so that the primary electron beam 76 can bombard diamond 24. Anode 72 was also made of graphite, but with no gold plating. Graphite was selected for the anode because of its low secondary electron emission coefficient.

The diamond wafer 24 was coated on one side only with thin layers of metals which serve as the electrical contact to the cathode holder. Typical materials used for this metallization are tungsten with gold overcoat. The thickness of these layers were 500 Å/1500 Å each. The diamond wafer was temporarily placed inside a hydrogen plasma for surface termination treatment.

The diode assembly was placed into a vacuum chamber containing an electron gun. The typical chamber vacuum condition where these experiments were performed was $2–3 \times 10^{-6}$ torr. The electron gun generated a low current electron beam (up to 20 mA) with electron energies variable from 30 to 55 kV. The electron beam was allowed to focus and move around so that most of the beam was impinging on the metalized side of the diamond wafer 24. The bombarding electron beam 76 penetrated into the diamond target generating multiple electron-hole pairs which caused the diamond target to become electrically conductive. Current was monitored by monitor 75. The gap between anode 72 and diamond 24 was controlled by actuator 77.

The electrons then drift toward the uncoated (emission) side under the influence of the applied electric field. Some of these electrons are recombined with holes before they reach the emission side. The recombination process reduces the number of the electrons available for emission into vacuum. The higher the applied field strength, the lower the recombination loss. The field strength is limited by the breakdown between the cathode and anode surfaces. In the experiment the applied voltage was limited to 150 V to avoid breakdown issues. The anode to cathode distance in the experiment could not be measured accurately, but was estimated to be 100 to 150 μm. Therefore the average field in the diode region was only 1–1.5 V/μm.

At lower electron energy the electron emission current was very small. But with increasing primary electron energy, more and more electron emission was observed. Current densities exceeding 20 $A/cm^2$ were generated and were consistent with a Child's Law limitation.

NEGATIVE ELECTRON AFFINITY

It is important that the emission side of the diamond have a low and preferably negative electron affinity. It has been predicted that the <111> and <100> surfaces of diamond, when hydrogen terminated, exhibit negative electron the affinity. Experiments by applicants support a conclusion of negative electron affinity by hydrogen terminated <111> diamond surface. Cesium is known to exhibit a NEA, but is highly reactive chemically. Diamond on the other hand is very stable. Applicants' experiments have shown that diamond emission is not degraded by air or moisture.

FIELD EMISSION FLAT PANEL DISPLAYS

A potential major application of this concept lies in field-emission flat panel displays. In this instance, conventional field emitter cathodes are used to illuminate with a beam of electrons a diamond cathode which amplifies the current in the beam. In doing so, the primary field emitters are insulated from exposure to the output phosphor by a piece of diamond film which is chemically robust. Reverse ion-bombardment associated with the phosphor and its gas load is eliminated. In addition, the requirements on the primary field emitters are drastically reduced, as smaller emission currents are required. Typically, to get the necessary current without subsequent amplification, electric fields near the breakdown limits are required and array lifetime is poor. With a bombarded-diamond-cathode amplifier the primary field emitter construction can be much more robust, resulting in improved emission and lifetime characteristics.

Experiments by the applicants have demonstrated Child's law limited emission current densities of 20 $amps/cm^2$. Thus very large current densities can be emitted by diamond cathodes. In experiments without proper hydrogen surface termination, and with unknown surface orientation, current gains of 12 have been observed.

Figure 5:
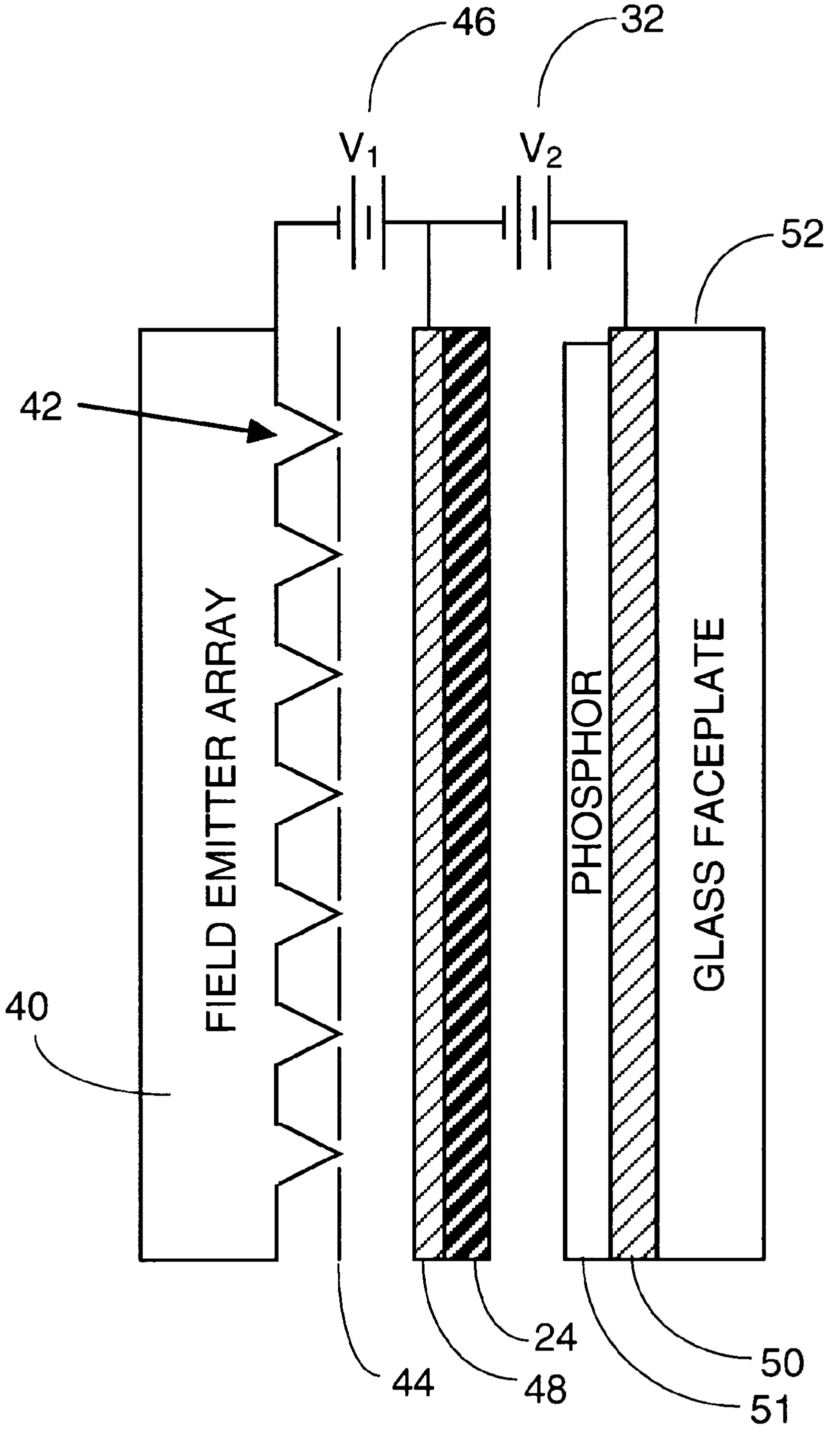
FIG. 5 shows the present invention applied to provide a flat panel display.

FIG. 5 is a drawing describing the present invention utilized to provide a flat panel display. A prior art field emitter array 40 with emitter tips 42 provides a spatially varying seed current controlled by gates 44. Voltage source 46 accelerates electrons from array 40 toward anode 48 and into diamond 24 where the electrons create multiple electron-hole pairs. Electrons are drawn out of diamond 24 by acceleration grid 50 into phosphor surface 51 to create a spatially varying display illumination. The elements shown in FIG. 5 are contained in a vacuum tube (not shown) and are mounted on glass faceplate 52. For flat panel displays we recommend use of diamonds produced by chemical vapor deposition (CVD diamonds). Such diamonds can be produced in large flat sheets with the appropriate thickness.

THERMIONIC CATHODE REPLACEMENT

Figure 6:
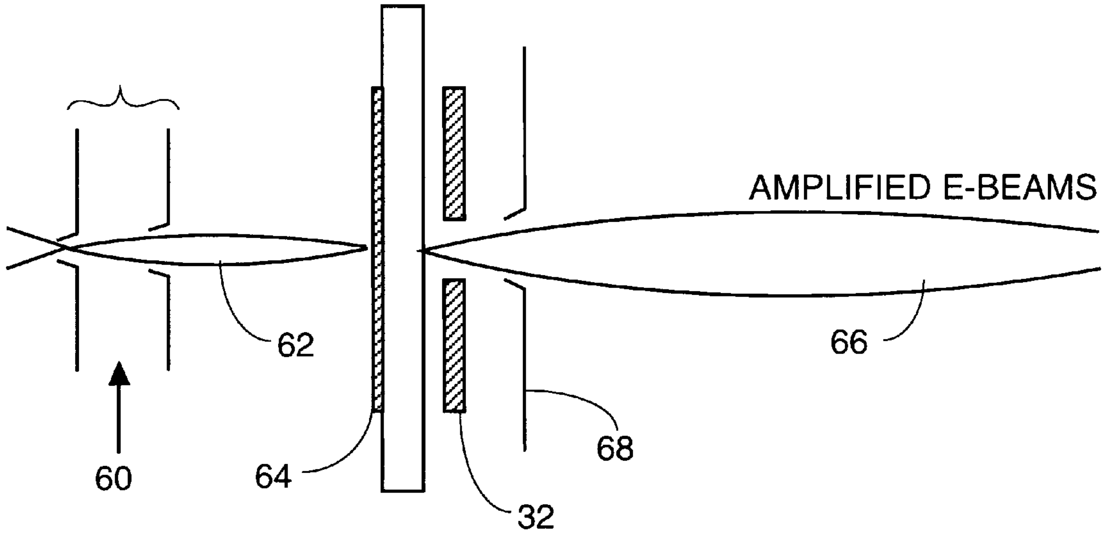
FIG. 6 shows a replacement for thermionic cathodes.

FIG. 6 shows an application of the present invention to replace thermionic cathodes which are high consumers of electric power due to the cathode heating power. A conventional low current field emitter 60 produces a low current electron beam 62 which is accelerated into diamond 24 by anode 64 producing electron-hole pairs. Electrons are drawn out of diamond 24 by acceleration grid 32 to produce amplified beam 66 which is focused by focusing grid 68.

CATHODE RAY TUBE

Figure 7A:
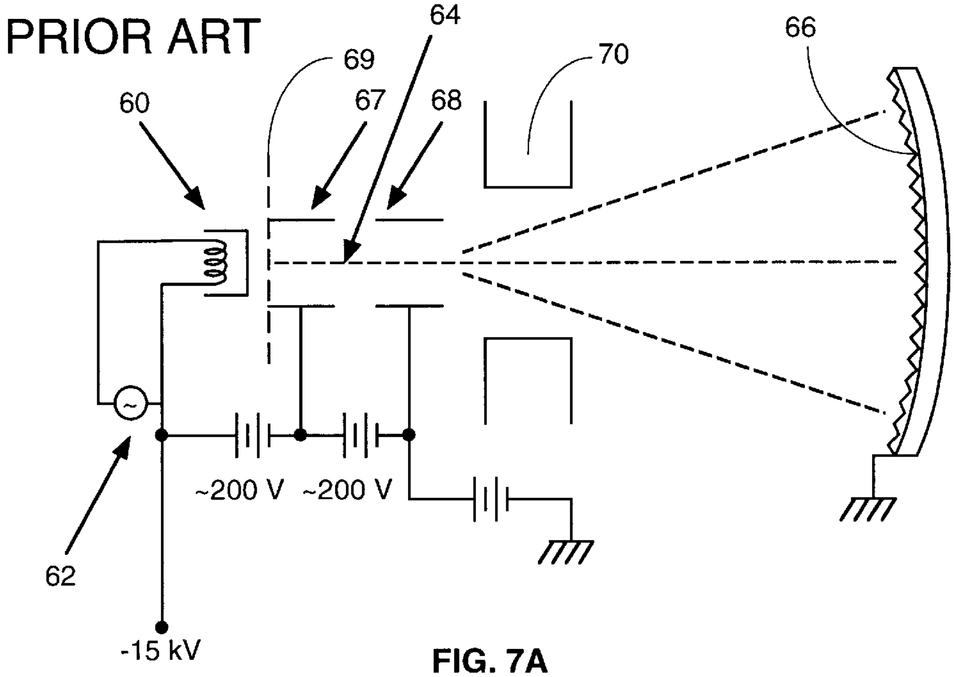
FIGS. 7A and 7B compare an embodiment of the present invention to a prior art cathode ray tube.
Figure 7B:
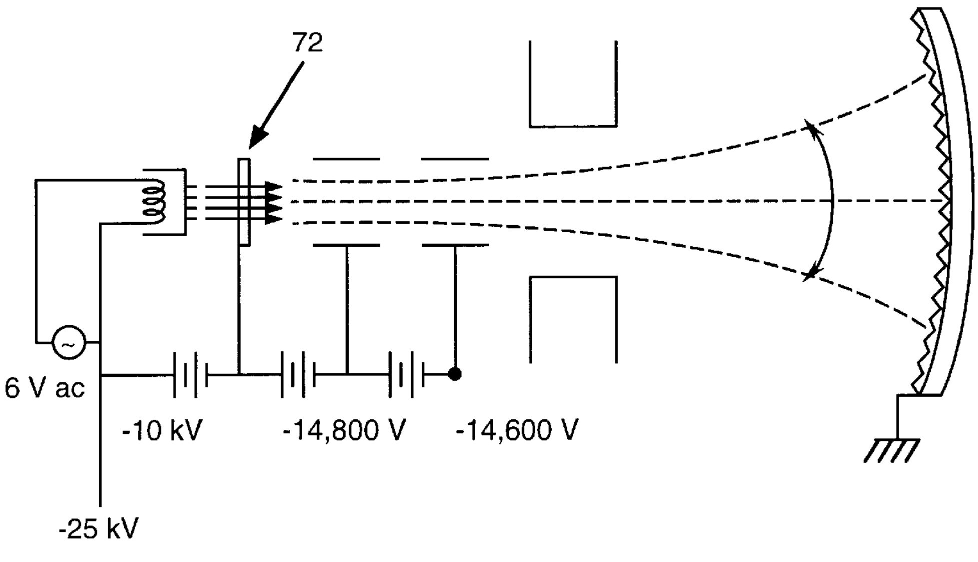

FIGS. 7A and 7B show an application of the present invention to provide an improved cathode ray tube. FIG. 7A shows the principal elements of a typical prior art cathode ray tube. A tungsten cathode filament 60 at −15 KV which is heated with a 6 V AC source 62 ejects a beam 64 of electrons toward phosphor surface 66 of the cathode ray screen which is at ground potential. The electron beam is focused by cylindrical plates 67 and 68, controlled by grid 69 and steered by steering mechanism 70. (This steering force is provided by electrostatic plates in an electrostatic CRT as shown in FIG. 7A or in the case of an electromagnetic CRT (typical TV tube) the force is provided by electromagnetic coils.)

FIG. 7B shows the improved version of cathode ray tube. It is essentially the same as the one shown in FIG. 7A except the cathode potential is now about −25 KV and a diamond amplifier 72 is inserted down stream of the cathode and is provided with a grid held at 15 KV. Electrons are accelerated into the diamond film where they are amplified by a factor of about 600. To the right of diamond amplifier 72, the cathode ray tube is essentially the same as the prior art version depicted in FIG. 7A. This improvement is applicable to both electrostatic CRT's as well as electromagnetic CRT's.

FAST PHOTODETECTORS

Figure 8A:
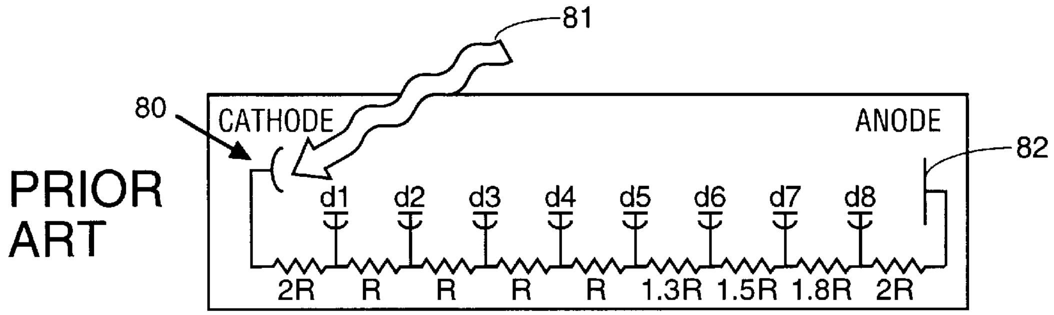
FIGS. 8A, 8B and 8C compare an embodiment of the present invention to two prior art photodetectors.
Figure 8B:
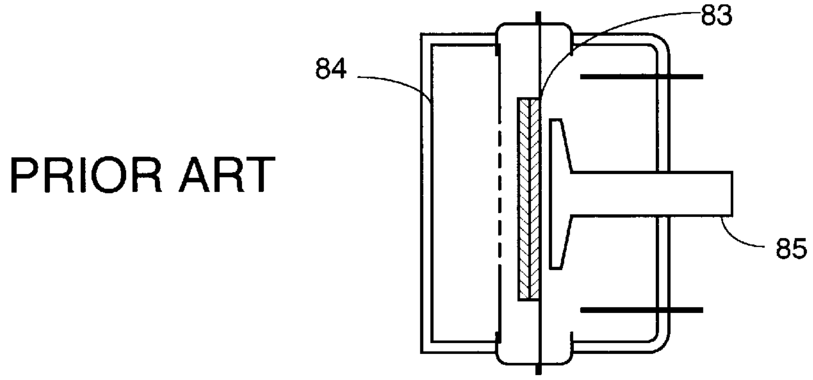
Figure 8C:
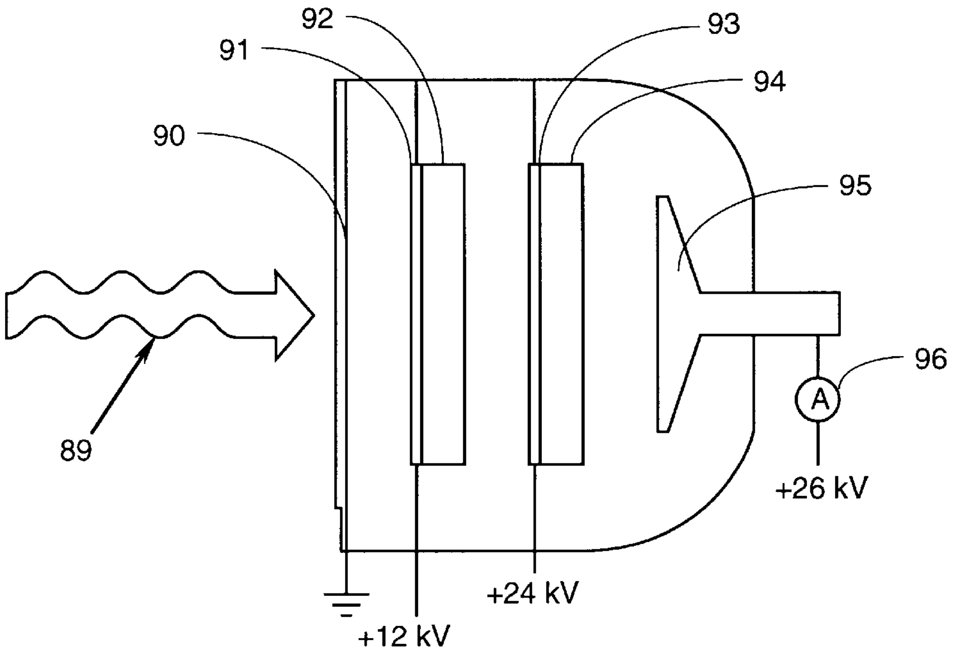

FIGS. 8A, 8B and 8C show an application of the present invention to detect very low level high frequency light pulses. FIG. 8A is a sketch of a prior art photomultipler tube which is used to detect low level light pulses. A photon 81 illuminates photo-cathode 80 ejecting at least one electron which is accelerated to anode d1 and upon impact releases a larger number of electrons which are in turn accelerated further down the tube to be multiplied several times to produce a greatly amplified electrical pulse at anode 82 which is proportional to the initial light pulse. One problem with this technology is that the 9 or so amplification steps require significant time which limits the frequency response of the tube.

FIG. 8B shows another prior art device in which a two stage microchannel plate 83 is used to amplify electrons produced in photo-cathode 84. The resulting electrons are collected on anode 85.

FIG. 8C shows the present invention applied to produce a much faster response photodetector. A light pulse 89 (which may consist of as few as one photon) strikes photo cathode 90 knocking out one or more elections which are accelerated by a strong electric field produced by grid 91 at about 12 KV positioned about 1.5 mm from photo cathode 90. Electrons accelerated toward first grid 91 are absorbed in first diamond plate 92 where they produce a large number of electron hole pairs. Many of the electrons produced are drawn out of diamond plate 92 and accelerated toward second grid 93 at about 24 KV. These electrons are absorbed in second diamond plate 94 where each electron produces many additional electron-hole pairs. Most of the electrons are drawn out of diamond plate 94 and accelerated toward anode 95. These electrons are detected by detector 96 as an anode current pulse. The pulse is in proportion to the intensity of light pulse 89. The advantage of this photodetector over the prior art detection is that the diamond amplifiers are very fast. The typical transit time across the diamond is about $10^{-11}$ seconds. Therefore, we can expect data transmission at rates well in excess of 1 GHz. Also, diamonds contribute zero dark current which can be a serious problem with prior art devices. These devices are especially useful in fiber optics communication and free space laser communication. Communication at rates of 10 GHz should be possible.

Figure 9A:
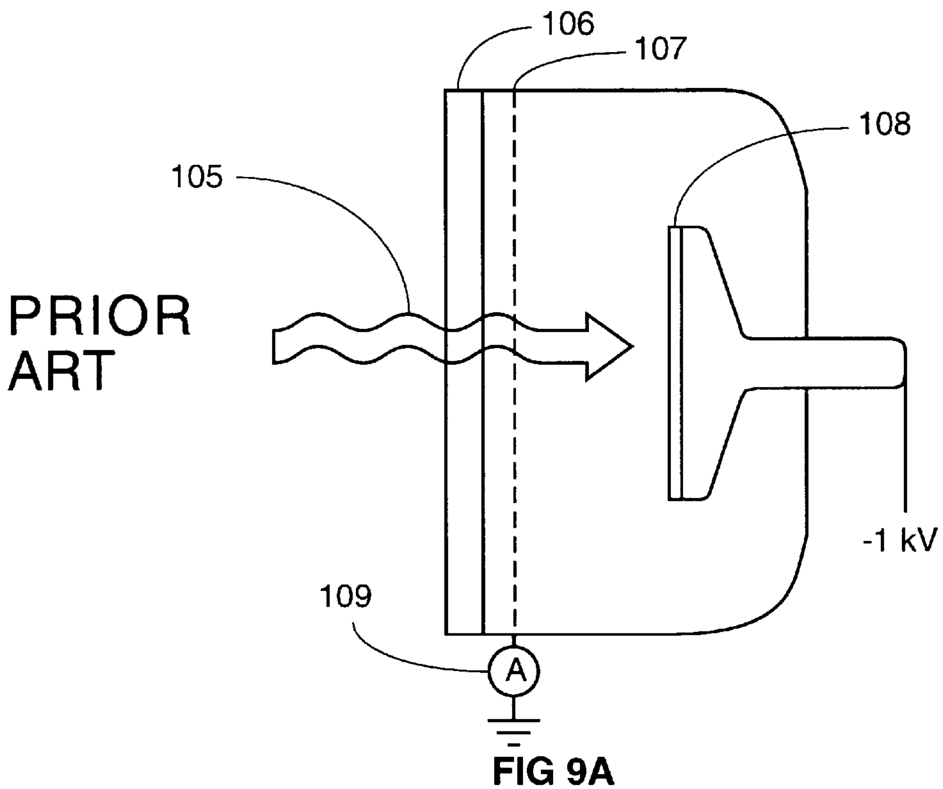
FIGS. 9A and 9B compare an embodiment of the present invention to a different prior art photodetector.
Figure 9B:
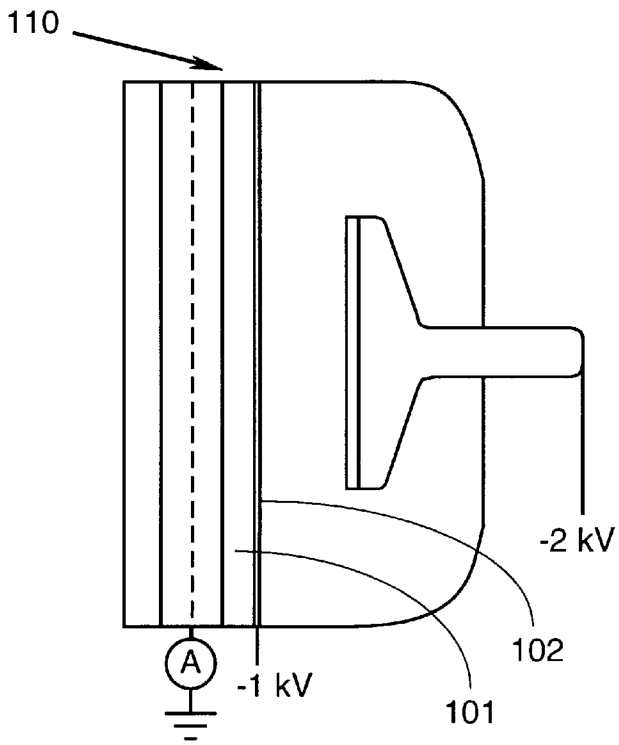

FIGS. 9A and 9B show a slightly different method of fabricating a fast photodiode using the present invention in relation to a different prior art photodetector. FIG. 9A shows the principles of the prior art detector. In this case photons 105 pass through glass cover 106 and grid 107 and are absorbed in photo-cathode 108 knocking out electrons. The electrons are accelerated toward grid 107 by the 1 KV negative bias applied to photo-cathode 108. A pulse is recorded on current detector 109.

Our version of this detector adds a diamond amplifier 110 as shown in FIG. 9B which comprises a thin diamond film 101 an acceleration grid 102 maintained at ~1 KV. We increase the cathode voltage to ~2 KV. Thus, greater detection sensitivity is achieved. In this embodiment the gain can be on the order of 60. Since photo-cathode, diamond amplifier and grid are held in close proximity, no significant signal delay will be resulted in this embodiment. If additional sensitivity is desired more than one diamond amplifier could be used as indicated in FIG. 8B.

IMAGE INTENSIFIER

Figure 10A:
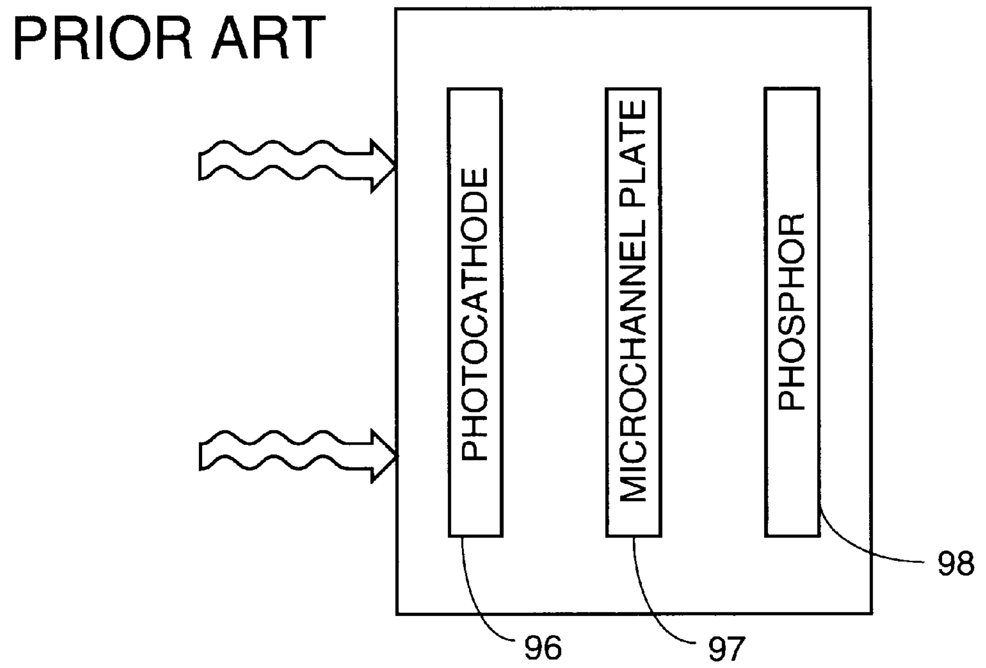
FIGS. 10A and 10B compare an embodiment of the present invention to a prior art image intensifier.
Figure 10B:
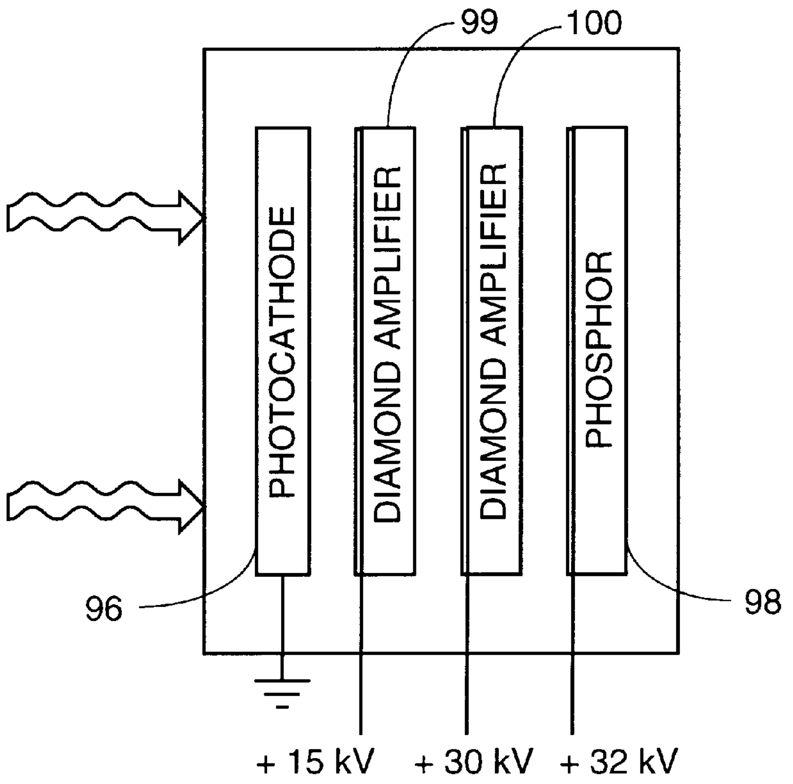

FIGS. 10A and 10B demonstrate an application of the present invention to produce an image intensifier. A prior art image intensifier comprises a photo-cathode plate 96 a microchannel plate 97 and a phosphor screen 98. For our image intensifier we replace the microchannel plate 97 with two diamond amplifiers 99 and 100. The amplifiers are spaced apart by about 1.5 mm with electric potentials of about 15 KV, 30 KV and 32 KV applied to the two diamond amplifiers and the phosphor screen as shown in FIG. 10B.

The above descriptions do not limit the scope of this invention but are examples of preferred embodiments. Those skilled in the art will envision many possible variations which are within its scope. The thin diamond may be natural or man-made such as CVD diamonds and it could be polycrystalline or monocrystalline. The phosphor plate in the image intensifier can be replaced with an electron sensitive CCD. The scope of the invention is described by the following claims:

We claim:

1. A flat panel display device comprising:

a) a controlled electron beam means for producing a large number of controlled electron beams, b) a thin diamond electron beam amplifier for amplifying said large number of controlled electron beams, said amplifier comprising:

1) a thin diamond sheet defining an illumination side and an emission side, 2) an acceleration grid, and 3) a voltage potential means for applying an electric field between said illumination side of said thin diamond sheet and said acceleration grid, wherein, when said illumination side of said diamond is illuminated by said large number of controlled electron beams, electron hole pairs are created in said diamond sheet and some of said created electrons are accelerated through said emission side of said diamond sheet to produce a large number of amplified electron beams corresponding to said controlled electron beams but having higher current than said controlled electron beams.

2. A flat panel display device as in claim 1 wherein said controlled electron beam means comprises a field emission array.

3. A flat panel display device as in claim 2 wherein said field emission array comprises a large number of spatial control gates.

* * * * *